(12) United States Patent
Konno et al.

(10) Patent No.: US 8,512,864 B2
(45) Date of Patent: Aug. 20, 2013

(54) COMPONENT FOR ROTARY MACHINE

(75) Inventors: Yuya Konno, Hiroshima (JP); Toyoaki Yasui, Hiroshma (JP); Kyoichi Ikeno, Hiroshima (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 150 days.

(21) Appl. No.: 13/056,735

(22) PCT Filed: Jan. 20, 2009

(86) PCT No.: PCT/JP2009/050732
§ 371 (c)(1),
(2), (4) Date: Jan. 31, 2011

(87) PCT Pub. No.: WO2010/016282
PCT Pub. Date: Feb. 11, 2010

(65) Prior Publication Data
US 2011/0135946 A1 Jun. 9, 2011

(30) Foreign Application Priority Data
Aug. 6, 2008 (JP) ................... 2008-203191

(51) Int. Cl.
*B32B 9/00* (2006.01)
(52) U.S. Cl.
USPC .......................................... 428/408
(58) Field of Classification Search
USPC .......................................... 428/408
See application file for complete search history.

(56) References Cited

U.S. PATENT DOCUMENTS

| | | | | |
|---|---|---|---|---|
| 5,198,263 A * | 3/1993 | Stafford et al. | ............... | 427/577 |
| 5,266,409 A * | 11/1993 | Schmidt et al. | ............... | 428/698 |
| 5,275,850 A * | 1/1994 | Kitoh et al. | .................... | 428/408 |
| 5,316,842 A * | 5/1994 | Herb et al. | ..................... | 428/408 |
| 6,312,766 B1 * | 11/2001 | Pai et al. | ......................... | 427/577 |
| 6,468,642 B1 * | 10/2002 | Bray et al. | ..................... | 428/408 |
| 6,572,937 B2 * | 6/2003 | Hakovirta et al. | ............ | 427/577 |
| 7,160,616 B2 * | 1/2007 | Massler et al. | ................ | 428/408 |
| 7,247,348 B2 * | 7/2007 | Power | .......................... | 427/577 |
| 7,306,778 B2 * | 12/2007 | Chaffin | ......................... | 428/408 |
| 2003/0118843 A1 | 6/2003 | Reiss et al. | | |
| 2004/0213675 A1 | 10/2004 | Blangetti et al. | | |

FOREIGN PATENT DOCUMENTS

| | | |
|---|---|---|
| DE | 44 17 235 | 11/1994 |
| DE | 100 56 241 | 5/2002 |
| EP | 589641 * | 3/1994 |
| JP | 61-257466 | 11/1986 |
| JP | 08-030264 | 9/1988 |

(Continued)

OTHER PUBLICATIONS

Supplementary European Search Report issued Oct. 27, 2011 in corresponding European Patent Application No. 09804769.9.

(Continued)

*Primary Examiner* — Archene Turner
(74) *Attorney, Agent, or Firm* — Wenderoth, Lind & Ponack, L.L.P.

(57) ABSTRACT

A component for a rotary machine which is configured such that a hard film composed of ceramics and an anti-fouling film composed of a fluorine-containing diamond-like carbon film are laminated on the surface of a base material, and which has superior drain erosion resistance and fouling resistance in an environment where a gas comes in direct contact therewith.

10 Claims, 13 Drawing Sheets

(56) References Cited

FOREIGN PATENT DOCUMENTS

| | | | |
|---|---|---|---|
| JP | 2001-269938 | | 10/2001 |
| JP | 2003-027206 | | 1/2003 |
| JP | 2004-027289 | | 1/2004 |
| JP | 2004-283699 | | 10/2004 |
| JP | 2005-330556 | | 12/2005 |
| JP | 2006-291307 | | 10/2006 |
| JP | 2007-071031 | | 3/2007 |
| JP | 2007-071032 | | 3/2007 |
| JP | 2007-162613 | * | 6/2007 |
| JP | 2007-213715 | | 8/2007 |

OTHER PUBLICATIONS

International Search Report issued Feb. 24, 2009 in International (PCT) Application No. PCT/JP2009/050732.

Written Opinion of the International Searching Authority issued Feb. 24, 2009 in International (PCT) Application No. PCT/JP2009/050732.

European Office Action issued Mar. 4, 2013 in corresponding European Application No. 09 804 769.9.

\* cited by examiner

– 1 –

COMPONENT FOR ROTARY MACHINE

TECHNICAL FIELD

The present invention relates to a component for rotary machines.

Priority is claimed on Japanese Patent Application No. 2008-203191, filed Aug. 6, 2008, the contents of which are incorporated herein by reference.

BACKGROUND ART

Conventionally, in rotating components such as a blade used in a rotary machine such as a steam turbine or a compressor pump, surface treatment is performed in consideration of heat resistance, corrosion resistance, and so forth. A steam turbine is driven by steam, which serves as a working fluid, being injected into the rotor blades of the turbine. Accordingly, rotary machine components such as rotor blades and rotors of a stream turbine (steam turbine blades) come in direct contact with steam. Moreover, a compressor (compressor pump), which is used at a chemical plant or the like and which compresses various types of fluid, receives power from outside to rotate an impeller, thereby compressing the fluid. Also in this type of compressor pump, rotary machine components such as the impeller and rotor come in direct contact with gas.

Here, in those components such as the blade of the steam turbine and the impeller of the compressor pump, with which water droplets contained in a gas collide at high speed, there is a problem in that the colliding water droplets cause erosion wear to occur on the surface. In those cases where this type of erosion wear occurs, the component vibrates and this vibration may cause damage thereto in some cases.

Furthermore, in the component used in a rotary machine described above, a so-called fouling phenomenon, in which ceramic material such as $SiO_2$ contained in the gas become attached, may occur in some cases. Accordingly, if ceramic material become attached on a component, there is a problem in that the operating efficiency of the component is reduced, and consequently the efficiency of the entire apparatus is reduced.

As a measure for preventing the above erosion wear and fouling, there is generally employed a method in which a film for suppressing the above phenomenon is coated on the substrate surface.

For example, as a measure for suppressing the above erosion wear, there is known a method of using a laminated structure such as illustrated in FIG. 17A and FIG. 17B. This method is a technique in which hard films 103a and 103b composed of TiN, CrN or the like are formed on a base material 101 by means of a physical vapor deposition (PVD) method, and if necessary, an intermediate layer 102 composed of Cr or the like is further formed (for example, refer to Patent Document 1). Moreover, as a measure for suppressing erosion wear, there are known: a method of applying Stellite (registered trademark) cladding by welding; and a method in which a hard film 104 composed of WC—NiCo or the like is formed on a base material 101 by means of thermal spraying as illustrated in FIG. 17C (for example, refer to Patent Documents 2 and 3).

However, this type of erosion resistant hard film described above does not have fouling resistance, and therefore, there is a problem in that the level of the fouling resistance is low despite the improvement having been made in the erosion resistance.

Meanwhile, as the measure for preventing the above fouling, for example, there has been proposed a technique of forming a plated film 111 containing fluorine resin particles on a base material 110 as shown in FIG. 18A. The plated film 111 containing fluorine resin particles is such that fluorine resin particles 111b are dispersed in the plating 111a (for example, refer to Patent Documents 4 and 5). Moreover, there is a method such that a fluorine resin layer 113, in which ceramic particles 113b are dispersed in a fluorine resin 113a, is coated on the base material 110 via a sprayed layer 112 as shown in FIG. 18B. In addition, there is also known a technique of forming a SermaLon coating, which is a fluorine resin based film (for example, refer to Patent Document 6).

Moreover, as the fouling prevention measure, in addition to that described above, there has been proposed a method in which a fluorine resin is coated on a base material in a gas equipment component (for example, refer to Patent Document 7). Furthermore, there has been proposed a method such that a coating containing fluorine, the surface energy of which has been reduced, is formed on a base material (for example, refer to Patent Document 8). Furthermore, there has been proposed a method such that a nitride hard film on a base material is flattened and smoothed to thereby reduce physical adsorption (for example, refer to Patent Document 9).

However, these coatings provided with fouling resistance described above are soft and the level of their erosion resistance is low. Therefore in an environment where a gas comes in direct contact therewith and erosion is likely to occur, there is a problem in that the coating becomes separated.

[Patent Document 1] Japanese Examined Patent Application, Second Publication No. H08-30264
[Patent Document 2] Japanese Unexamined Patent Application, First Publication No. 2004-27289
[Patent Document 3] Japanese Unexamined Patent Application, First Publication No. 2003-27206
[Patent Document 4] Japanese Unexamined Patent Application, First Publication No. 2007-71031
[Patent Document 5] Japanese Unexamined Patent Application, First Publication No. 2007-71032
[Patent Document 6] Japanese Unexamined Patent Application, First Publication No. 2006-291307
[Patent Document 7] Japanese Unexamined Patent Application, First Publication No. 2004-283699
[Patent Document 8] Japanese Unexamined Patent Application, First Publication No. 2007-213715
[Patent Document 9] Japanese Unexamined Patent Application, First Publication No. 2007-162613

SUMMARY OF INVENTION

Problems to be Solved by the Invention

As described above, heretofore, there has not been proposed a method capable of realizing both erosion resistance and fouling resistance, and consequently there is a strong demand for a component for a rotary machine capable of realizing both of these properties at the same time.

The present invention takes into consideration the above circumstances, with an object of providing a component for a rotary machine having superior erosion resistance and fouling resistance in an environment where a gas comes in direct contact therewith.

Means for Solving the Problem

In order to solve the above problems, the present invention employs the following configuration.

A component for a rotary machine according to the present invention is configured such that on the surface of a base material, there are laminated a hard film composed of ceramics, and an anti-fouling film composed of a diamond-like carbon film containing fluorine.

In the component for a rotary machine in this type of configuration, the anti-fouling film of the above configuration is provided. As a result, fouling, in which ceramic material contained in a gas become attached, is suppressed. Moreover, in the component for a rotary machine having this type of configuration, even in those cases where the anti-fouling film is worn out in a portion where erosion has occurred, it is possible to suppress erosion progress in the hard film.

Moreover, the anti-fouling film of the component for a rotary machine according to the present invention may be such that in the above configuration, the fluorine concentration thereof is uniform in a range of not less than 10 mass percent and not more than 40 mass percent.

In the component for a rotary machine having this type of configuration, the type of fouling described above can be suppressed more effectively.

Furthermore, the component for a rotary machine according to the present invention may be such that in the above configuration, between the hard film and the anti-fouling film, there is further formed an intermediate hard film composed of diamond-like carbon.

In the component for a rotary machine having this type of configuration, the level of adhesion between the hard film and the anti-fouling film is further improved, and erosion is suppressed more effectively.

Furthermore, the component for a rotary machine according to the present invention may be such that in the above configuration, between the base material and the hard film, there is further formed an intermediate layer.

In the component for a rotary machine having this type of configuration, by providing the intermediate layer, internal stress which occurs in the hard film is relieved, and the level of adhesion between the base material and the hard film is improved.

Moreover, the anti-fouling film of the component for a rotary machine according to the present invention may be such that in the above configuration, a concentration gradient is provided in the film thickness direction so that the fluorine concentration becomes higher with approach from the hard film side to the anti-fouling film surface, and it is of a gradient composition film in which the fluorine concentration in the surface is not less than 10 mass percent and not more than 40 mass percent.

Furthermore, the component for a rotary machine according to the present invention may be such that in the above configuration having the anti-fouling film, which is a gradient composition film, provided therein, between the hard film and the anti-fouling film, there is further formed an intermediate hard film composed of diamond-like carbon.

Moreover, the component for a rotary machine according to the present invention may be such that in the above configuration having the anti-fouling film, which is a gradient composition film, provided therein, and the intermediate hard film further provided therein, between the base material and the hard film, there is further formed an intermediate layer.

In the component for a rotary machine having this type of configuration, there is provided the anti-fouling film having the concentration gradient described above, and thereby fouling resistance is given to the topmost surface of the anti-fouling film. Meanwhile, the level of hardness is increased on the hard film side of the anti-fouling film, and consequently, erosion resistance is given thereto and the level of adhesion with respect to the hard film is improved.

Moreover, the hard film of the component for a rotary machine according to the present invention, in the above configuration, may be composed of at least one or more types of materials among TiN, TiAlN, CrN, TiC, TiCN, and ZrN.

In the component for a rotary machine having this type of configuration, the type of erosion described above can be suppressed more effectively.

Moreover, the anti-fouling film in the portion of the component for a rotary machine according to the present invention where erosion has occurred, may have been worn out in the above configuration.

In the component for a rotary machine having this type of configuration, in actual use, even in a state where the anti-fouling film in the erosion occurring portion has been worn out, the hard film thereunder suppresses the progress of erosion.

A component for a rotary machine according to the present invention is configured such that on the surface of the base material, there is formed the anti-fouling film composed of a diamond-like carbon film containing fluorine. Moreover, the anti-fouling film is such that a concentration gradient is provided in the film thickness direction so that the fluorine concentration becomes higher with approach from the hard film side to the anti-fouling film surface, and it is of a gradient composition film in which the fluorine concentration in the surface is not less than 10 mass percent and not more than 40 mass percent.

In the component for a rotary machine having this type of configuration, the anti-fouling film having the concentration gradient described above is formed on the base material, and thereby fouling resistance is given to the topmost surface of the anti-fouling film. Meanwhile, the level of hardness is increased on the base material side of the anti-fouling film, and consequently, erosion resistance is given thereto and the level of adhesion is improved. As a result, even with a single-layer film structure, fouling and erosion are both suppressed.

Furthermore, the component for a rotary machine according to the present invention may be such that in the above configuration, between the base material and the anti-fouling film, there is further formed an intermediate layer.

In the component for a rotary machine having this type of configuration, by providing the intermediate layer, internal stress which occurs in the anti-fouling film is relieved, and the level of adhesion between the base material and the anti-fouling film is improved.

Moreover, a steam turbine according to the present invention is a steam turbine having rotor blades such that the rotor blade is configured with the component for a rotary machine in which the hard film composed of ceramics and the anti-fouling film composed of a diamond-like carbon film containing fluorine are laminated on the surface of the base material.

Effect of the Invention

According to the component for a rotary machine of the present invention, even in those cases where it is used in an environment where it comes in direct contact with a gas, fouling and erosion are both suppressed, and it is therefore possible to set long maintenance intervals, and realize a component for a rotary machine which has a long operating life and can be operated at low cost.

DESCRIPTION OF THE REFERENCE SYMBOLS

Figure 1:
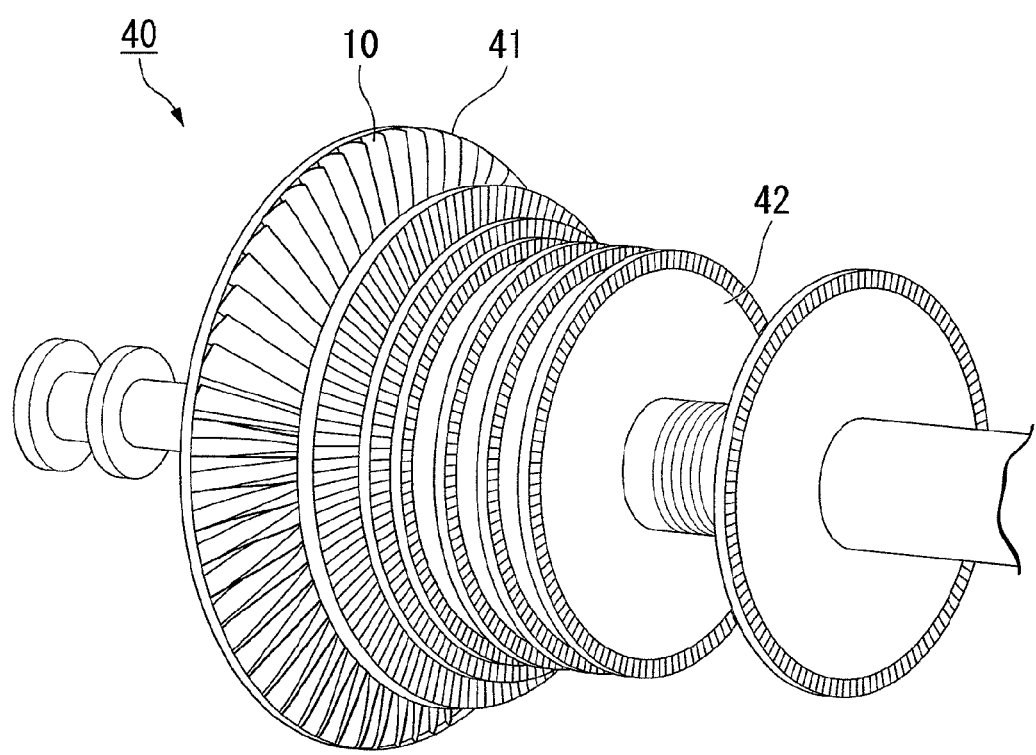
FIG. 1 is a perspective view for schematically describing steam turbine blades, which are an example of a component for a rotary machine according to the present invention, and it is a schematic diagram showing a steam turbine which uses the steam turbine blades.

1 Base material
1a Surface (base material)
2 Hard film
3, 31, 32 Anti-fouling film
3a, 31a, 31a Surface (anti-fouling film)
4 Intermediate layer
5 Intermediate hard film
10, 11, 12, 13, 13A, 14, 15, 16, 17, 18 Steam turbine blade (component for a rotary machine)
40 Steam turbine
E Region (erosion occurring portion)

DETAILED DESCRIPTION OF THE INVENTION

Hereunder, taking steam turbine blades as examples, suitable embodiments of a component for a rotary machine according to the present invention are described, with reference to the drawings.

Figure 2:
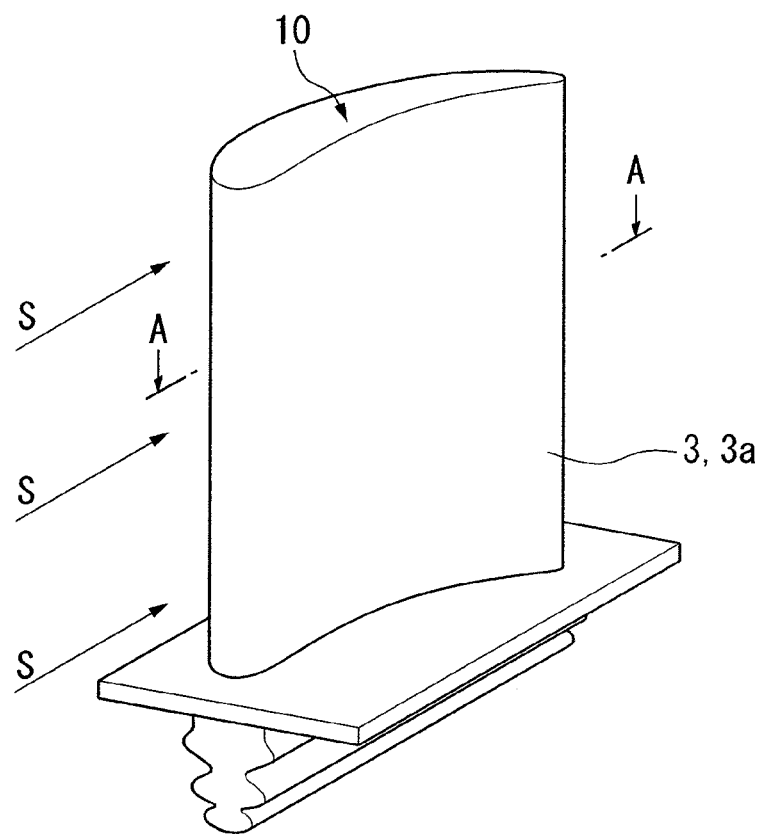
FIG. 2 is a perspective view for schematically describing a first embodiment of the steam turbine blade according to the present invention.
Figure 3:
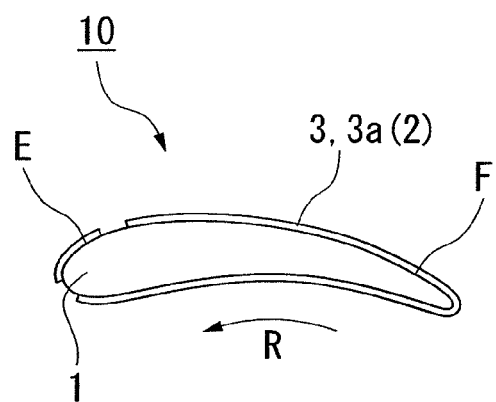
FIG. 3 is a schematic diagram for schematically describing an example of the steam turbine blade according to the present invention, and is an A-A cross-sectional view of FIG. 2.
Figure 4:
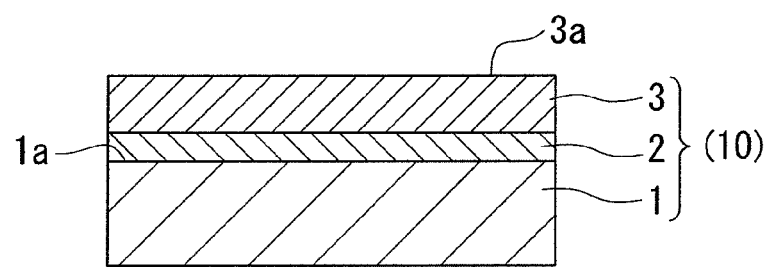
FIG. 4 is a diagram for schematically describing the first embodiment of the steam turbine blade according to the present invention, and it is a cross-sectional view showing a structure in which a hard film and an anti-fouling film are sequentially laminated on a base material.
Figure 7:
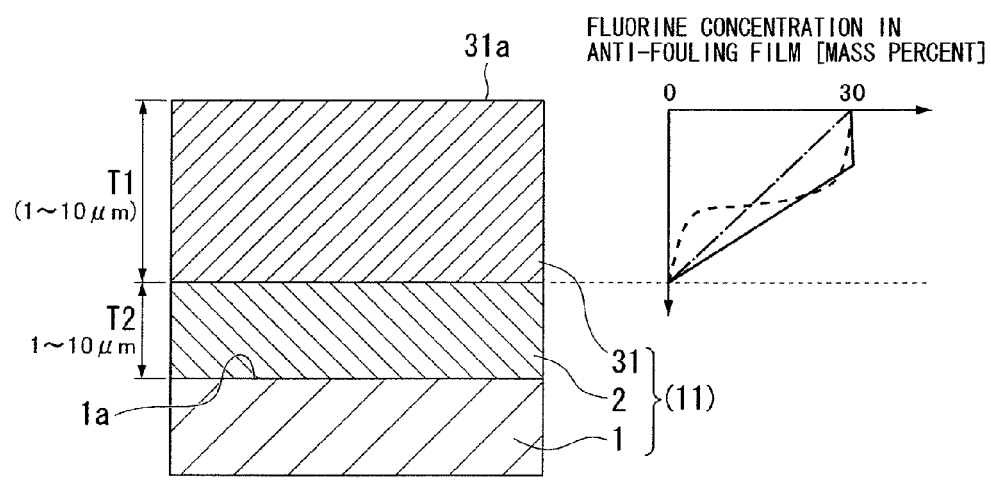
FIG. 7 includes diagrams for schematically describing a second embodiment of the steam turbine blade according to the present invention, and there are provided a cross-sectional view showing a structure in which a hard film and an anti-fouling film are sequentially laminated on a base material, and a graph showing a fluorine concentration gradient in the film thickness direction of the anti-fouling film.
Figure 8:
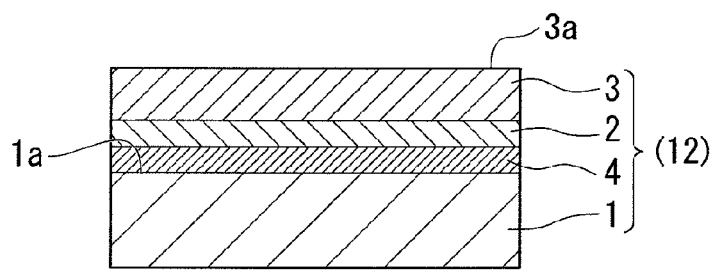
FIG. 8 is a diagram for schematically describing a third embodiment of the steam turbine blade according to the present invention, and it is a cross-sectional view showing a structure in which an intermediate layer, a hard film, and an anti-fouling film are sequentially laminated on a base material.
Figure 9A:
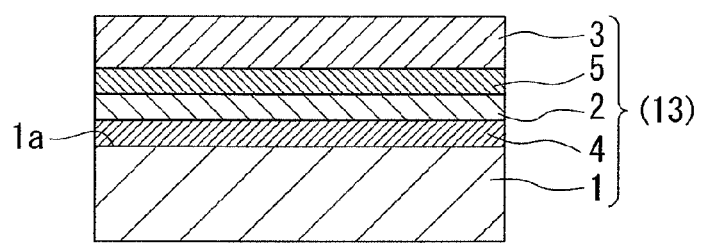
FIG. 9A is a diagram for schematically describing a fourth embodiment of the steam turbine blade according to the present invention, and it is a cross-sectional view showing a structure in which an intermediate layer, a hard film, an intermediate hard film, and an anti-fouling film are sequentially laminated on a base material.
Figure 9B:
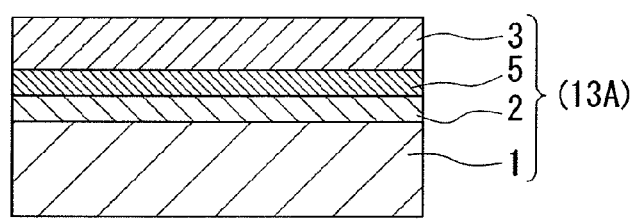
FIG. 9B is a diagram for schematically describing the fourth embodiment of the steam turbine blade according to the present invention, and it is a cross-sectional view showing a structure in which a hard film, an intermediate hard film, and an anti-fouling film are sequentially laminated on a base material.
Figure 10:
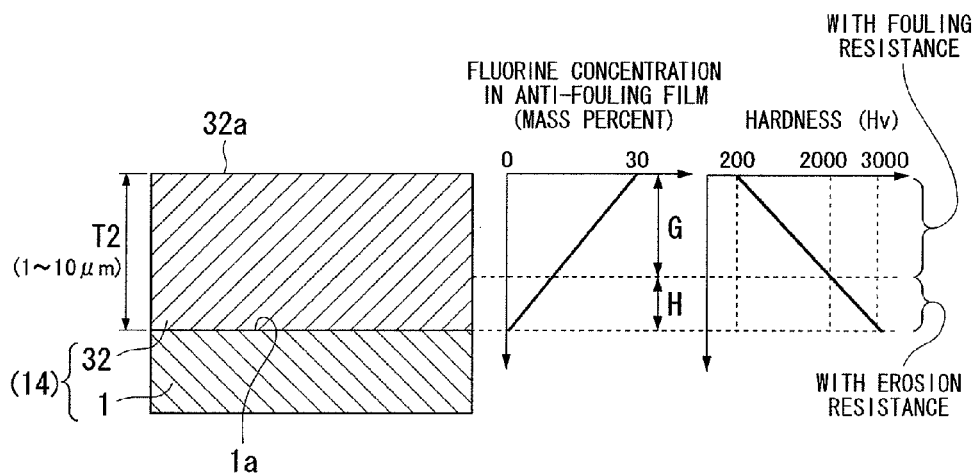
FIG. 10 includes diagrams for schematically describing a fifth embodiment of the steam turbine blade according to the present invention, and there are provided a cross-sectional view showing a structure in which an anti-fouling film is laminated on a base material, a graph showing a fluorine concentration gradient in the film thickness direction of the anti-fouling film, and a graph showing a relationship between the fluorine concentration gradient (or film thickness) and hardness.
Figure 11:
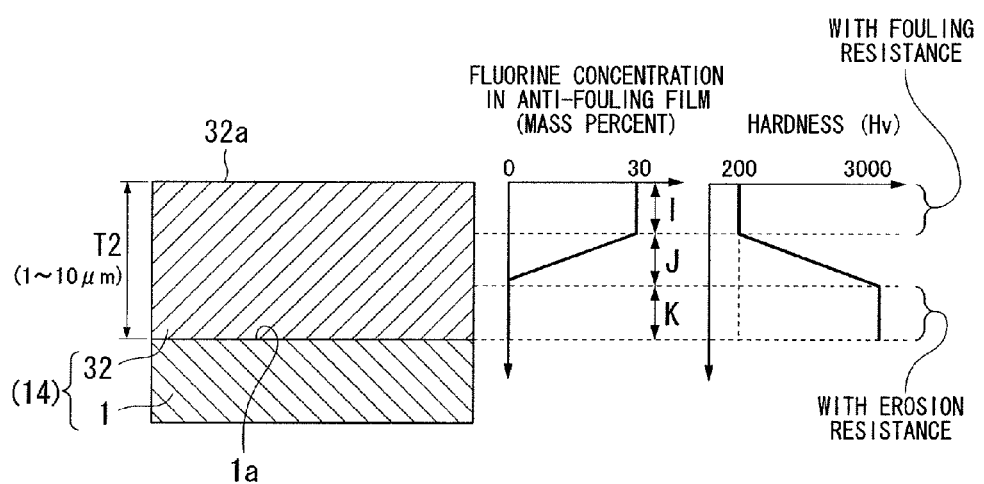
FIG. 11 includes diagrams for schematically describing the fifth embodiment of the steam turbine blade according to the present invention, and there are provided a cross-sectional view showing a structure in which an anti-fouling film is laminated on a base material, a graph showing a fluorine concentration gradient in the film thickness direction of the anti-fouling film, and a graph showing a relationship between the fluorine concentration gradient (or film thickness) and hardness.
Figure 12:
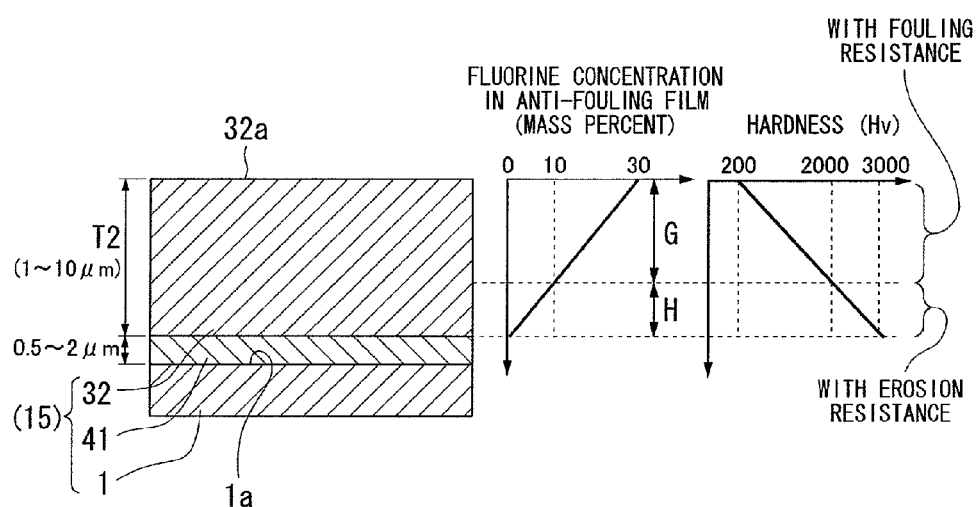
FIG. 12 includes diagrams for schematically describing a sixth embodiment of the steam turbine blade according to the present invention, and there are provided a cross-sectional view showing a structure in which an intermediate layer and an anti-fouling film are laminated on a base material, a graph showing a fluorine concentration gradient in the film thickness direction of the anti-fouling film, and a graph showing a relationship between the fluorine concentration gradient (or film thickness) and hardness.
Figure 13:
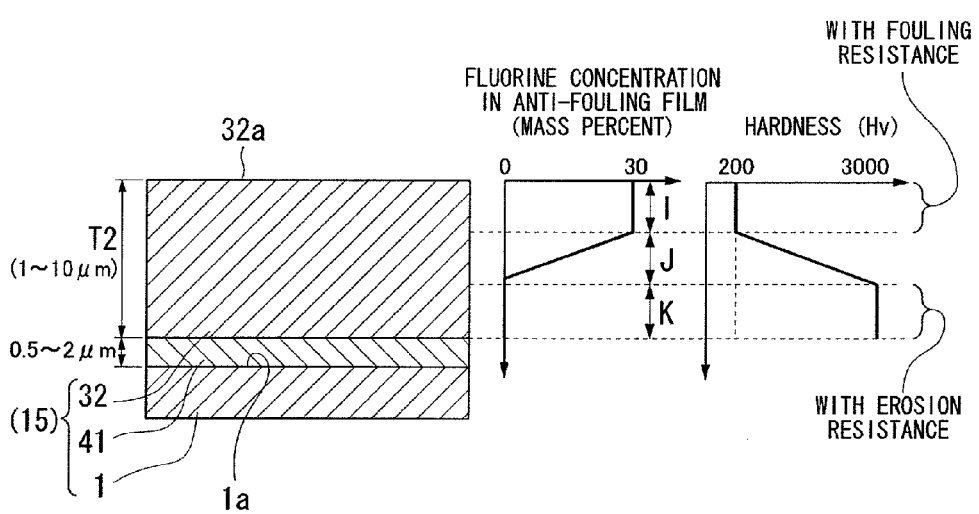
FIG. 13 includes diagrams for schematically describing the sixth embodiment of the steam turbine blade according to the present invention, and there are provided a cross-sectional view showing a structure in which an intermediate layer and an anti-fouling film are laminated on a base material, a graph showing a fluorine concentration gradient in the film thickness direction of the anti-fouling film, and a graph showing a relationship between the fluorine concentration gradient (or film thickness) and hardness.
Figure 14:
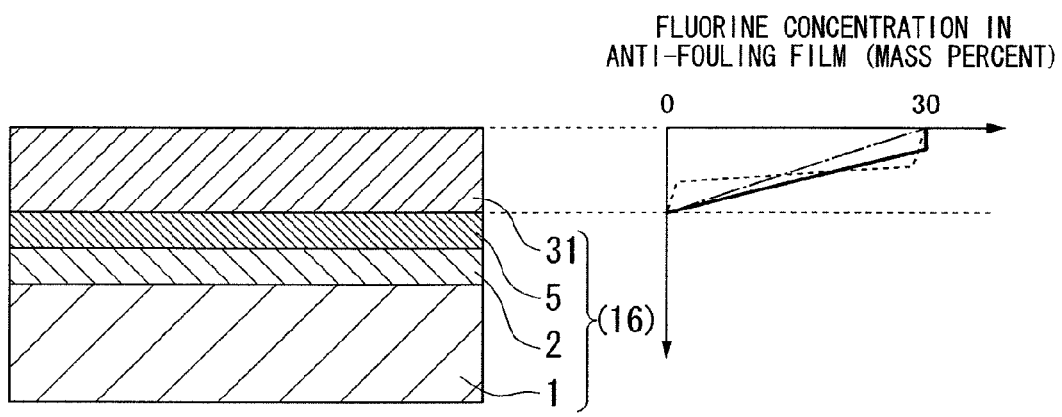
FIG. 14 includes diagrams for schematically describing a seventh embodiment of the steam turbine blade according to the present invention, and there are provided a cross-sectional view showing a structure in which a hard film, an intermediate hard film, and an anti-fouling film are sequentially laminated on a base material, and a graph showing a fluorine concentration gradient in the film thickness direction of the anti-fouling film.
Figure 15:
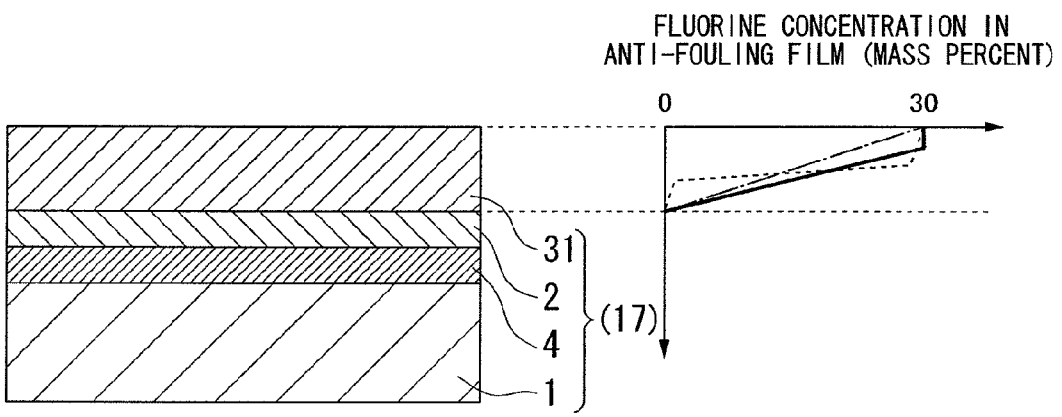
FIG. 15 includes diagrams for schematically describing an eighth embodiment of the steam turbine blade according to the present invention, and there are provided a cross-sectional view showing a structure in which an intermediate layer, a hard film, and an anti-fouling film are sequentially laminated on a base material, and a graph showing a fluorine concentration gradient in the film thickness direction of the anti-fouling film.
Figure 16:
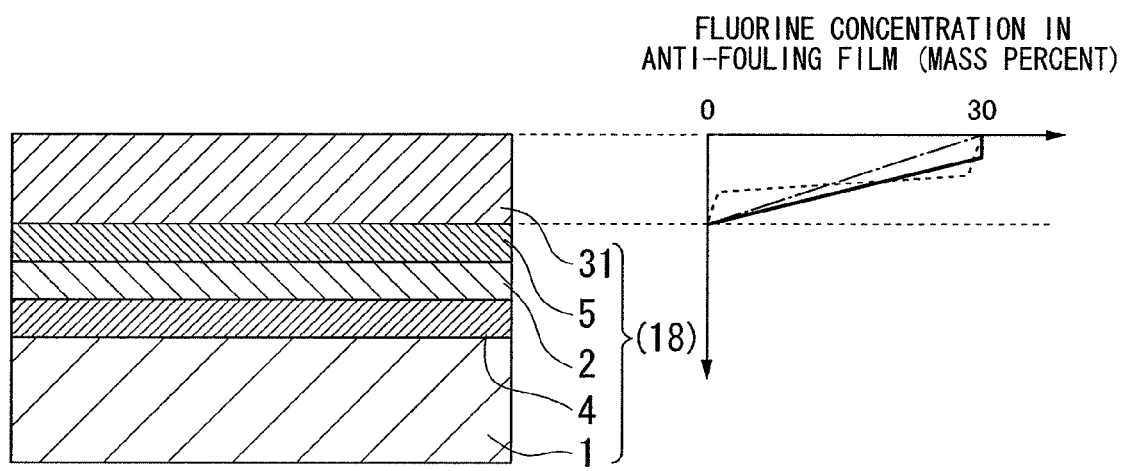
FIG. 16 includes diagrams for schematically describing a ninth embodiment of the steam turbine blade according to the present invention, and there are provided a cross-sectional view showing a structure in which an intermediate layer, a hard film, an intermediate hard film, and an anti-fouling film are sequentially laminated on a base material, and a graph showing a fluorine concentration gradient in the film thickness direction of the anti-fouling film.
Figure 17A:
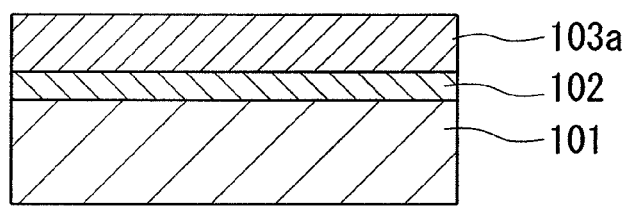
FIG. 17A is a diagram for describing a conventional steam turbine blade, and is a schematic cross-sectional view showing a laminated structure in which respective films are formed on a base material.
Figure 17B:
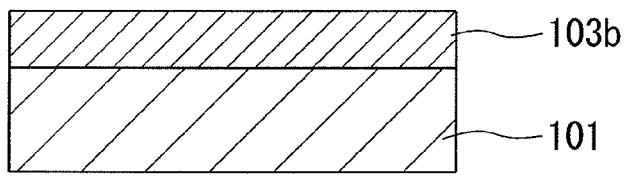
FIG. 17B is a diagram for describing a conventional steam turbine blade, and is a schematic cross-sectional view showing a laminated structure in which each film is formed on a base material.
Figure 17C:
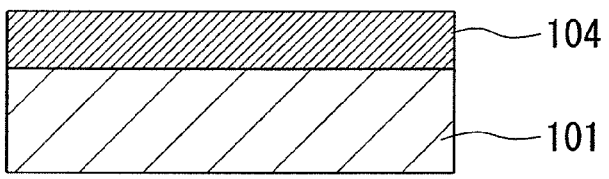
FIG. 17C is a diagram for describing a conventional steam turbine blade, and is a schematic cross-sectional view showing a laminated structure in which each film is formed on a base material.
Figure 18A:
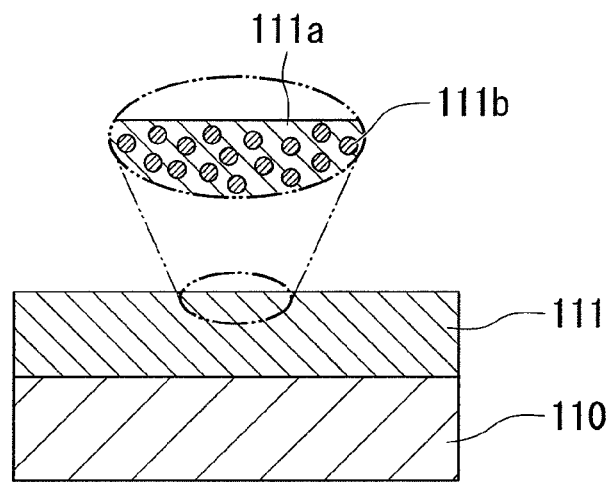
FIG. 18A is a diagram for describing a conventional steam turbine blade, and is a schematic cross-sectional view showing a laminated structure in which each film is formed on a base material, and showing an enlarged view of the topmost surface.
Figure 18B:
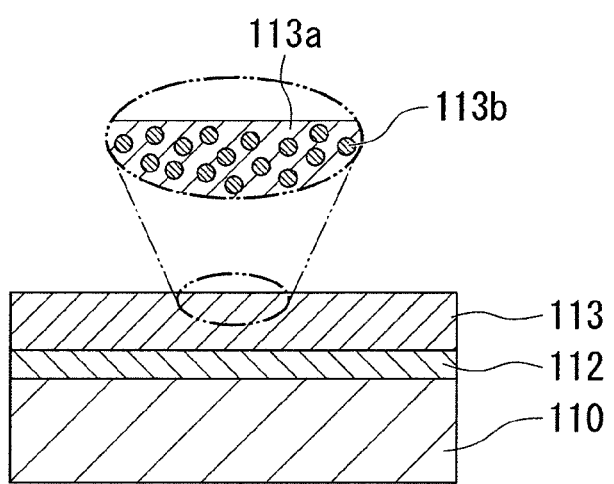
FIG. 18B is a diagram for describing a conventional steam turbine blade, and is a schematic cross-sectional view showing a laminated structure in which each film is formed on a base material, and showing an enlarged view of the topmost surface.

FIG. 1 to FIG. 6 are schematic diagrams for describing a first embodiment of a steam turbine blade according to the present invention. FIG. 1 is a schematic diagram showing an example of a steam turbine which uses steam turbine blades. FIG. 2 is a perspective view showing the steam turbine blade. FIG. 3 is a cross-sectional view of FIG. 1. FIG. 4 is a cross-sectional view showing a structure in which a hard film and an anti-fouling film are sequentially laminated on a base material. FIG. 5A and FIG. 5B are graphs showing characteristic changes associated with changes in the fluorine content percentage in the anti-fouling film. FIG. 6A, FIG. 6B, and FIG. 6C are graphs for describing an operation and effect of the steam turbine blade. Moreover, FIG. 7 is a schematic diagram for describing a second embodiment of the steam turbine blade according to the present invention. FIG. 8 is a schematic diagram for describing a third embodiment. FIG. 9A and FIG. 9B are schematic diagrams for describing a fourth embodiment. Furthermore, FIG. 10 and FIG. 11 are schematic diagrams for describing a fifth embodiment of the steam turbine blade according to the present invention. FIG. 12 and FIG. 13 are schematic diagrams for describing a sixth embodiment. Moreover, FIG. 14 is a schematic diagram for describing a seventh embodiment of the steam turbine blade according to the present invention. FIG. 15 is a schematic diagram for describing an eighth embodiment. FIG. 16 is a schematic diagram for describing a ninth embodiment.

The respective diagrams referenced in the following description are diagrams for describing the steam turbine blade (component for a rotary machine), and the size, thickness, and dimension of each part shown in the diagrams may differ from actual dimensional relationships.

First Embodiment

Hereunder, a first embodiment of a steam turbine blade, which is a component for a rotary machine according to the present invention, is described in detail.

The steam turbine blade according to the present invention is a component for a rotary machine to be used for example, in a steam turbine 40 illustrated in FIG. 1, as a rotor blade (refer to steam turbine blades 10 in the diagram). The steam turbine 40 is driven by steam, which acts as a working fluid, being injected into the steam turbine blades 10 (rotor blades) fitted on a turbine 41. Therefore, this type of steam turbine 40 is of a configuration in which the steam turbine blade 10 comes in direct contact with steam.

The steam turbine blade 10 of the present embodiment is such that, as shown in the cross-sectional view of FIG. 4, on a surface 1a of a base material 1, there is formed a hard film 2 for improving drain erosion resistance, and on the hard film 2, there is formed an anti-fouling film 3 for improving fouling resistance.

(Steam Turbine Blade of First Embodiment)

The steam turbine blade 10 of the present embodiment, as shown in the cross-sectional view of FIG. 4, is schematically configured such that on the surface 1a of the base material 1, there are laminated the hard film 2 and the anti-fouling film 3 (also refer to the cross-sectional view of FIG. 3). The hard film 2 is composed of ceramic, and the anti-fouling film 3 is composed of diamond-like carbon (DLC) containing fluorine.

Hereunder, there are described in detail the base material 1, the hard film 2, and the anti-fouling film 3 which respectively constitute the steam turbine blade 10 of the present embodiment.

As the base material 1, materials generally used in this technical field such as stainless steel including SUS410J1 may be used without any particular limitations, and a material appropriately selected from these generally used materials may be used.

The hard film 2 in the steam turbine blade 10 is a film which is coated on the surface 1a of the base material 1, and is a film for giving erosion resistance to the steam turbine blade 10.

As the material of the hard film 2, any material may be employed as long as the film is provided with a high level of adhesion and erosion resistance. However, it is preferably composed of any one material of a nitride, a carbide, a boride, and an oxide. Moreover, out of all these materials, the film is preferably composed of at least one or more types of materials namely TiN, TiAlN, CrN, TiC, TiCN, and ZrN. By configuring the hard film 2 with the above materials, as described later, it is possible to obtain the steam turbine blade 10 with superior wear resistance and erosion resistance.

The preferred film thickness of the hard film 2 is in a range of not less than 1 μm and not more than 30 μm. If the film thickness of the hard film 2 is less than 1 μm, it is difficult to obtain the effect of improving erosion resistance. Moreover, if the film thickness exceeds 10 μm, there is a possibility of an increase in stress in the film, which leads to separation, and the processing time at the time of film formation tends to become long. For these reasons, if the film thickness exceeds 30 μm, the level of internal stress in the hard film 2 becomes high and separation of the film becomes more likely. Furthermore, the preferred film thickness of the hard film 2 is in a range of not less than 3 μm and not more than 20 μm, and more preferably in a range of not less than 5 μm and not more than 15 μm.

The anti-fouling film 3 is a film formed on the hard film 2 in the steam turbine blade 10, and is a film for giving the steam turbine blade 10 fouling resistance.

The anti-fouling film 3 of the present embodiment is composed of DLC containing fluorine, and is capable of obtaining superior fouling resistance, strength, and wear resistance. This type of DLC (diamond like carbon) is generally used as a material for components which require a high level of strength and wear resistance. By employing a configuration with this DLC containing fluorine, fouling resistance is further given to the anti-fouling film 3.

The anti-fouling film 3 is preferably composed of DLC with a fluorine concentration in a range of not less than 10 mass percent and not more than 40 mass percent. If the fluorine concentration in the anti-fouling film 3 is less than 10 mass percent, the surface energy becomes significant, and acquisition of an effect of improving the fouling resistance which reduces the amount of silica particles becoming attached becomes difficult. Therefore, lengthening of the maintenance cycle of the steam turbine blade 10 becomes difficult. If the fluorine concentration is less than 10 mass percent, the amount of attached ceramic material becomes half or greater than the amount of attached ceramic material in a conventional film composed of TiN for example, so that a significant fouling reduction effect may not be obtained in some cases.

Moreover, if the fluorine concentration exceeds 40 mass percent, the film hardness becomes less than 200 Hv and the hardness is insufficient. As a result, it may not be suitable in an environment of actual use.

Therefore, the anti-fouling film 3 is preferably composed of DLC, the fluorine concentration of which is in a range of not less than 10 mass percent and not more than 40 mass percent. The fluorine concentration is more preferably in a range of not less than 15 mass percent and not more than 38 mass percent, and most preferably in a range of not less than 20 mass percent and not more than 35 mass percent.

Figure 5A:
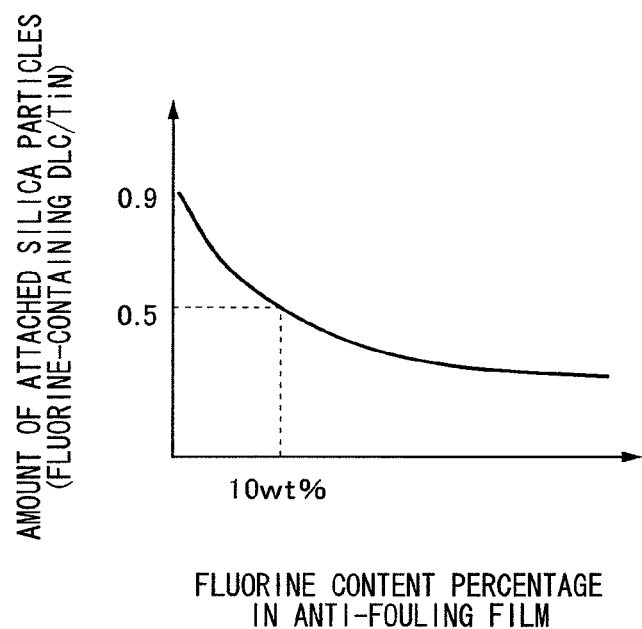
FIG. 5A is a diagram for schematically describing the first embodiment of the steam turbine blade according to the present invention, and it is a graph showing a relationship between the fluorine content percentage in the anti-fouling film and the amount of attached silica particles.

The graph of FIG. 5A shows a relationship between the fluorine content percentage (fluorine concentration) in the anti-fouling film 3 provided for the steam turbine blade 10 of the present embodiment, and the amount of attached silica particles, when a test was conducted to measure the amount of attached silica particles (fouling resistance test). For the testing method, Patent Document 4 (Japanese Unexamined Patent Application, First Publication No. 2007-71031, paragraphs 0064 to 0066) is to be referenced.

As shown in FIG. 5A, it can be understood that the amount of attached silica particles (fouling amount) rapidly rises when the fluorine content percentage in the anti-fouling film 3 becomes less than 10 mass percent.

The following is an overview of the testing method of measuring the amount of attached silica particles disclosed in Patent Document 4.

For the test specimen, there was used a test specimen obtained in a manufacturing method of a steam turbine blade of the first embodiment described later.

(Testing Method)

The test specimen was fitted in a drum and was subjected to a particle attachment evaluation test.

The particle attachment evaluation test was a test in which ultrafine silica ($SiO_2$) particles transported by a nitrogen ($N_2$) gas were blown at and thereby attached on the surface of the test specimen while rotating the drum.

The nitrogen gas was injected through a nozzle. The silica particles were supplied from a particle supply device to the vicinity of a nozzle outlet. Below the drum, there was installed a water tank. The water inside the water tank was brought to the boil at 100° C., and the water content was supplied to the test specimen. Moreover, the test specimen was heated using a heater installed on the inner side of the drum.

(Testing Condition)

The rotation speed of the drum was 10 rpm, and the test specimen was rotated at the same rotation speed as that of the drum. As the silica particles, fumed silica (grade 50) manufactured by NIPPON AEROSOL CO., LTD. was used. The temperature for heating the test specimen was 80° C. Moreover, the collision speed of the silica particles was 300 m/sec, and the test was conducted for 80 hours.

(Evaluation Method)

The amount of attached silica particles was measured based on the difference in mass of the test specimen before and after the test. The ratio between the amount Y (g) of silica particles attached on the surface of the test specimen, and the amount X (g) of silica particles attached on the surface of the test specimen with the hard film 2 (TiN) given to the base material (SUS410J1) thereof, was calculated as the amount of attached silica particles Z, using a formula (3).

$$Z=Y/X \qquad (3)$$

Figure 5B:
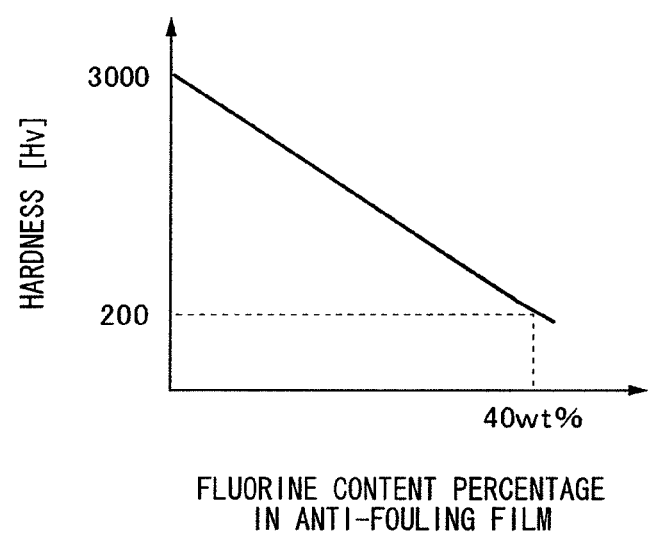
FIG. 5B is a diagram for schematically describing the first embodiment of the steam turbine blade according to the present invention, and it is a graph showing a relationship between the fluorine content percentage in the anti-fouling film and hardness.

Moreover, the graph of FIG. 5B shows a relationship between the fluorine content percentage (fluorine concentration) in the anti-fouling film 3 provided for the steam turbine blade 10, and the hardness of the anti-fouling film 3.

As shown in FIG. 5B, it is apparent that the hardness of the anti-fouling film 3 becomes less than 200 Hv and the strength becomes insufficient if the fluorine content percentage in the anti-fouling film 3 exceeds 40 mass percent.

The fluorine content percentage in the anti-fouling film 3 was measured using an X-ray photoelectron spectrometer ESCA3400 (product of KRATS) under the conditions of: anode: Mg, excitation voltage: 10 kV, and excitation current: 12 mA. The concentration distribution in the depth direction was analyzed by locally trimming the film by means of Ar ion etching and using the method for measuring the fluorine content percentage described above, and this procedure was repeatedly conducted.

The film hardness was tested using a micro-Vickers hardness tester where test loads were 10 gf and 50 gf.

The film thickness of the anti-fouling film 3 is preferably in a range of not less than 0.1 μm and not more than 10 μm, from the point that fouling resistance can be effectively given to the steam turbine blade 10. If the film thickness of the anti-fouling film 3 is less than 0.1 μm, acquisition of fouling resistance becomes difficult. Moreover, if the film thickness exceeds 10 μm, there is a possibility of an increase in stress in the film, which leads to separation, and the processing time at the time of film formation becomes long. Furthermore, the preferred film thickness of the anti-fouling film 3 is in a range of not less than 0.5 μm and not more than 5 μm, and more preferably in a range of not less than 0.8 μm and not more than 3 μm.

Moreover, it is preferable that the hard film 2 and the anti-fouling film 3 described above are formed on the entire surface 1a of the base material 1 in the steam turbine blade 10 illustrated in FIG. 2. By forming these respective films on the entire surface 1a of the base material 1, it is possible to more effectively obtain the effect of improving both the erosion resistance and fouling resistance described above.

Hereunder, the effect of improving the erosion resistance and fouling resistance of the steam turbine blade 10 according to the present invention is described.

A gas which contains vapors for driving the steam turbine 40 is supplied to the steam turbine 40 shown in FIG. 1. At this time, this vapor containing gas collides with the steam turbine blade 10 shown in FIG. 2 from the direction of arrow S illustrated in the diagram. As shown in the cross-sectional view of FIG. 3 (A-A cross-sectional view of FIG. 2), the steam turbine blade 10 rotates in the direction of arrow R in FIG. 3.

At this time, as shown in FIG. 3, the water content (drain) such as vapors contained in the gas collides primarily with a region E (erosion occurring portion: the heavy line region illustrated with reference symbol E in FIG. 3) of the steam turbine blade 10 at high speed. Therefore, the occurrence of erosion in this region E is likely. On the other hand, in a region F (fouling occurring portion: the heavy line region illustrated with reference symbol F in FIG. 3), which is a portion other than the region E, although the occurrence of erosion is unlikely, fouling, in which ceramic material such as silica contained in the gas becomes attached, is likely to occur. Furthermore, in the region E described above, high speed collision of the drain removes the attached substance even if the ceramic material have become attached, and therefore, the occurrence of fouling is unlikely.

Accordingly, in the steam turbine blade used in the steam turbine, the erosion occurring portion (region E shown in FIG. 3) and the fouling occurring portion (region F shown in FIG. 3) are different.

The steam turbine blade 10 of the present embodiment is such that on the surface 1a of the base material 1, there are sequentially laminated the hard film 2 and the anti-fouling film 3 configured as described above. Therefore, in actual use, in the region E, which is a portion where erosion is likely to occur, the drain contained in the gas collides therewith at high speed, and the soft anti-fouling film 3 wears out as a result. At this time, even in a case where the anti-fouling film 3 has been worn out and lost, the hard film 2 provided thereunder still gives the steam turbine blade 10 erosion resistance. Therefore, erosion progress in the region E is suppressed. Moreover, the portion other than this region E, that is, the region F is a portion where erosion is unlikely to occur in actual use. Therefore, the anti-fouling film 3 does not wear out in the region F, and the occurrence of fouling is suppressed. As a result, it is possible to ensure superior erosion resistance and fouling resistance on the entire surface 1a of the base material 1 of the steam turbine blade 10.

Figure 6A:
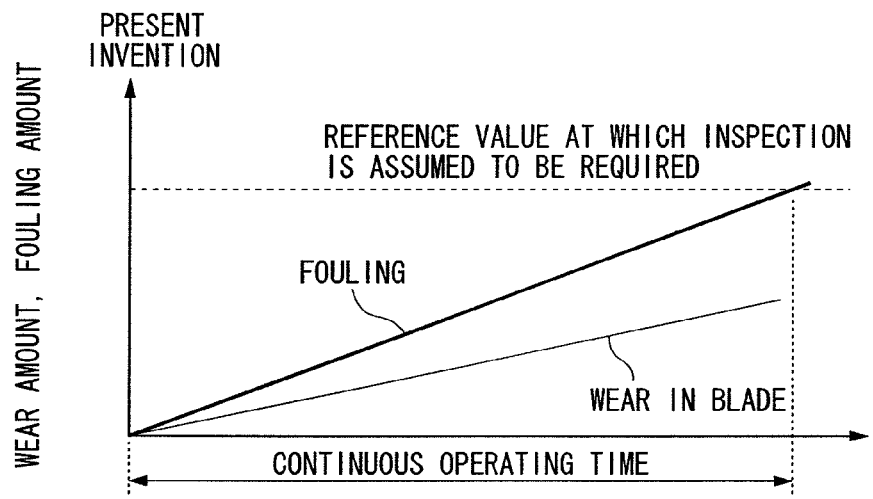
FIG. 6A is a diagram for schematically describing the first embodiment of the steam turbine blade according to the present invention, and it is a graph showing a relationship between continuous operating time, wear amount, and fouling amount in a case of using the steam turbine blade according to the present invention.
Figure 6B:
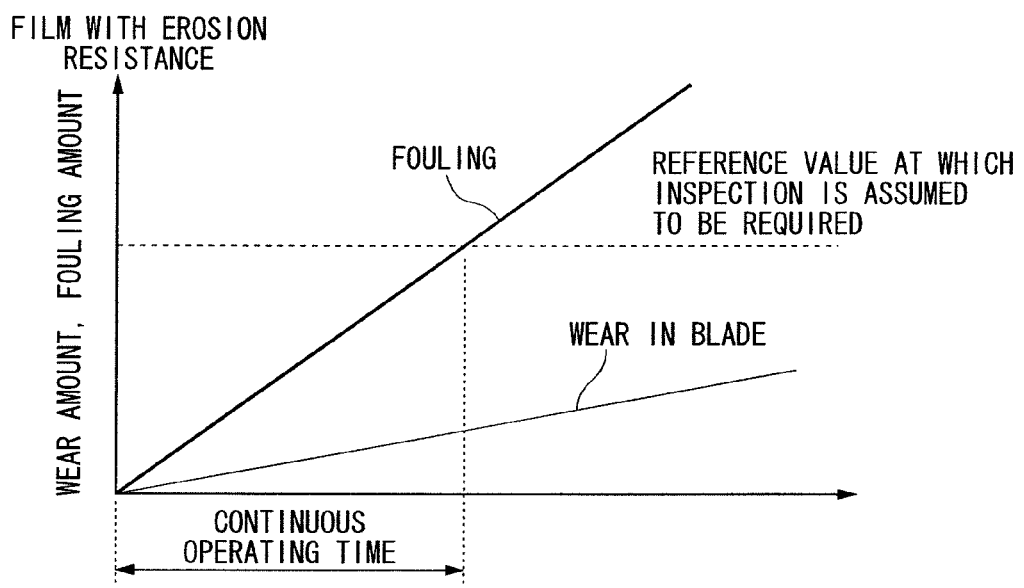
FIG. 6B is a diagram for schematically describing the first embodiment of the steam turbine blade according to the present invention, and it is a graph showing a relationship between continuous operating time, wear amount, and fouling amount in a case where a conventional film with only erosion resistance given thereto is provided.
Figure 6C:
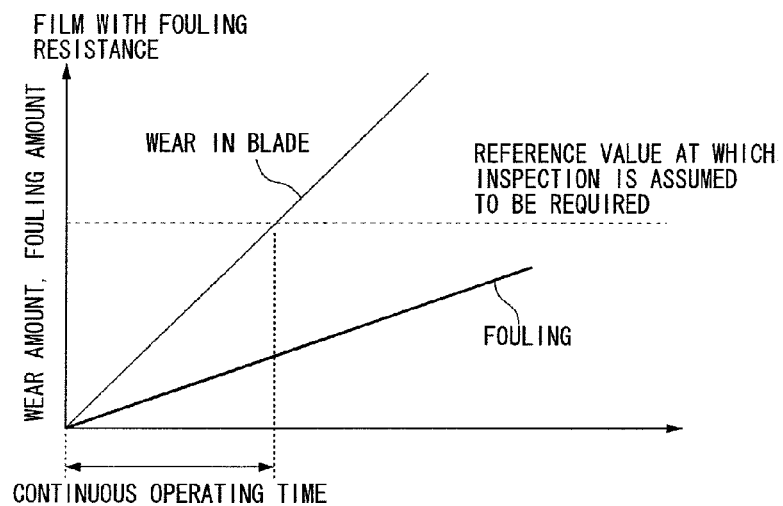
FIG. 6C is a diagram for schematically describing the first embodiment of the steam turbine blade according to the present invention, and it is a graph showing a relationship between continuous operating time, wear amount, and fouling amount in a case where a conventional film with only fouling resistance given thereto is provided.

Hereunder, an operation and effect of the steam turbine blade 10 of the present embodiment are described, using the graphs of FIG. 6A, FIG. 6B, and FIG. 6C. Here, FIG. 6A is a graph showing a relationship between operating time, amount of wear (erosion amount), and amount of fouling, in the case where the steam turbine blade 10, to which fouling resistance and erosion resistance are both given, was implemented in the steam turbine 40 shown in FIG. 1 and it was operated continuously. Moreover, FIG. 6B is a graph showing a characteristic in the case where a conventional steam turbine blade having a film, to which only erosion resistance was given, formed on a base material was implemented in a steam turbine and it was operated continuously in a manner similar to that described above. FIG. 6C is a graph showing a characteristic in the case of using a conventional steam turbine blade to which only fouling resistance was given.

As shown in the graph of FIG. 6B, it can be understood that in the case of the steam turbine blade to which only erosion resistance was given, the occurrence amount of fouling was high, and it reached, in a short continuous operating time, a reference value at which an inspection of the attached substance is assumed to be necessary. Moreover, as shown in the graph of FIG. 6C, it can be understood that in the case of the conventional steam turbine blade to which only fouling resistance was given, it reached, in a short continuous operating time, a reference value at which an inspection of the wear amount (erosion amount) is assumed to be necessary. Therefore, it is apparent that in those cases where the conventional steam turbine blade is used, the maintenance cycle for servicing and component replacement inevitably becomes short, and operating cost and so forth will rise as a result.

On the other hand, fouling resistance and erosion resistance are both given to the steam turbine blade 10 of the present embodiment. It can be understood that with this type of steam turbine blade 10, as shown in the graph of FIG. 6A, the amount of fouling and the amount of wear both take an extremely long time to reach a reference value at which an inspection thereof needs to be conducted. Therefore, the maintenance cycle can be set to a long cycle, and it is possible to significantly reduce the cost such as labor cost and component cost.

According to the steam turbine blade 10 of the first embodiment of the present invention described above, by providing the anti-fouling film 3 having the above configuration, it is possible to suppress the occurrence of fouling in which the ceramic material contained in the gas become attached. Furthermore, the steam turbine blade 10 is provided with the hard film 2 having the above configuration, and it is therefore possible, with the hard film 2, to suppress the progress of erosion even if erosion has occurred in the anti-fouling film 3, which is a soft film, in an environment where it comes in direct contact with a gas. Therefore, it is possible to realize a steam turbine blade 10 which has a superior level of both fouling resistance and erosion resistance, enables long maintenance intervals, has a long operating life, and can be operated at low running cost.

(Manufacturing Method of Steam Turbine Blade of First Embodiment)

Hereunder, there is described in detail a manufacturing method of the steam turbine blade 10 of the present embodiment. In the present embodiment, the surface-smoothed ceramic hard film 3 provided in the laminated structure of the steam turbine blade 10 shown in FIG. 4 is formed in a method described below.

The manufacturing method of a steam turbine blade of the present embodiment is a method in which the hard film 2 is formed on the surface 1a of the base material 1, and the anti-fouling film 3 composed of diamond-like carbon containing fluorine is formed on the hard film 2. The anti-fouling film 3 is formed by means of an ionic vapor deposition method, in which a reactive gas is ionized and deposited by discharging an electron beam, and a gas which at least contains hexafluorobenzene ($C_6F_6$) gas is used as the reactive gas.

The type of ionic vapor deposition method described above is a method in which the amount and energy of ions can be freely controlled, and it is therefore possible to form a thin film composed of fluorine containing DLC at a superior level of controllability. Moreover, by using a hexafluorobenzene gas as the reactive gas at this time, the material ionized by the above electron beam is efficiently film-formed as fluorine-containing DLC on the base material (on the hard film 2).

In the present embodiment, first, the surface 1a of the base material 1 is preliminarily processed so as to be a mirror-like surface at approximately Rz=0.5 μm. At this time, as the base material 1, a material SUS410J1 with an approximate size of 20×30×5 mm may be used for example.

Next, in the present embodiment, it is preferable that a pre-treatment is conducted for etching the surface of the base material 11. This pre-treatment is preferably conducted by the following method. First, having ultrasonic-cleaned the base material 1 in alcohol and then dried it, it is introduced into a sputtering apparatus and the pressure inside the apparatus is reduced to $3.0 \times 10^{-3}$ Pa or less by means of vacuum suction. Subsequently, it is baked using a heater, and then the surface of the base material 1 is exposed to Ar plasma to thereby etch it.

Next, in a state where the base material 1 is arranged inside the sputtering apparatus, the hard film 2 composed of TiN is formed on the surface 1a of the pre-treated base material 1 by means of a sputtering method. At this time, Ti is used as a target, and nitrogen gas is used as a reactive gas.

First, the temperature of the base material 1 is controlled at 300° C. by heating with use of a heater. Then, the hard film 2 composed of TiN is film-formed on the entire surface 1a of the base material by conducting glow discharge under respective conditions: film formation power approximately 1,000 W; flow rate of nitrogen supplied into the apparatus approximately 10 sccm; bias voltage of the base material approximately 100V; and power to be applied to the target approximately 4,000 W.

Next, the anti-fouling film 3 composed of fluorine-containing DLC is formed on the hard film 2 by means of the ionic vapor deposition method described above.

First, the base material 1, the surface 1a of which has the hard film 2 formed thereon, is introduced into an ionic vapor deposition apparatus, and the pressure inside the apparatus is reduced to $3.0 \times 10^{-3}$ Pa or less by means of vacuum suction. Then, a hexafluorobenzene gas is introduced into the ionic vapor deposition apparatus at a pressure in a range of not less than $2.0 \times 10^{-1}$ Pa and not more than $6.5 \times 10^{-1}$ Pa. Furthermore, by conducting electrical discharge under respective conditions: ion source anode current value approximately 0.4 A; ion source filament current value approximately 30 A; and base material bias voltage value approximately 1.5 kV, the anti-fouling film 3 composed of fluorine-containing DLC is formed on the entire surface of the hard film 2 formed on the surface 1a. At this time, the fluorine concentration in the anti-fouling film 3 is made uniform in a range of not less than 10 mass percent and not more than 40 mass percent as described above, and for example, it may be approximately 30 mass percent.

In the test for measuring the amount of attached silica particles described above, there was used a test specimen (20×30×5 mm) with the fluorine concentration in the anti-fouling film 3 at 30 mass percent, which was obtained in the above manufacturing method.

In the manufacturing method of the steam turbine blade 10 of the first embodiment of the present invention described above, the hard film 2 is formed on the surface 1a of the base material 1. Then, the anti-fouling film 3 is formed on this hard film 2 by means of an ionic vapor deposition method, using a gas which contains hexafluorobenzene gas as a reactive gas. By forming the anti-fouling film 3 composed of diamond-like carbon containing fluorine in this manufacturing method, the concentration of fluorine in the diamond-like carbon becomes an appropriate concentration. Therefore, it is possible to form an anti-fouling film 3 provided with a high level of fouling resistance. Accordingly, it is possible, at a high level of production efficiency, to manufacture the steam turbine blade 10 which has a superior level of both fouling resistance and erosion resistance, has a long operating life, and can be operated at low running cost.

In the present embodiment, there has been described a method of forming the anti-fouling film 3 by means of an ionic vapor deposition method. However, without being limited to this method, the film formation may be conducted by means of a sputtering method as with the case of the hard film 2 described above for example.

Second Embodiment

Hereunder, a steam turbine blade 11 of the present embodiment is described, with reference to FIG. 7. In the following description, the same reference symbols are given to configurations similar to those of the steam turbine blade 10 of the first embodiment, and detailed descriptions thereof are omitted.

The steam turbine blade 11 of the present embodiment is of a configuration such that on a hard film 2 on the surface 1a of a base material 1, there is laminated an anti-fouling film 31. The anti-fouling film 31 is such that a concentration gradient is provided in the film thickness T1 direction so that the fluorine concentration becomes higher with approach from the hard film 2 side to the surface 31a of the anti-fouling film 31, and the fluorine concentration in the surface 31a is in a range of not less than 10 mass percent and not more than 40 mass percent. Thus, the configuration differs from that of the steam turbine blade 10 of the first embodiment in that the anti-fouling film 31 is of a gradient composition film.

The anti-fouling film 3 provided in the steam turbine blade 11 of the present embodiment has a fluorine concentration gradient in the direction of film thickness T1 of the anti-fouling film 31 as shown in the graph in the schematic diagram of FIG. 7. In the shown example, the fluorine concentration on the hard film 2 side of the anti-fouling film 31 is approximately 0 mass percent. In contrast, the fluorine concentration on the surface 31a side of the anti-fouling film 31 is approximately 30 mass percent. Furthermore, in the graph of the shown example, the fluorine concentration shown with the solid line has a concentration gradient such that the fluorine concentration gradually becomes higher and rises to approximately 30 mass percent, at a thickness partway from the hard film 2 side of the anti-fouling film 31 in the direction of film thickness T1. When the fluorine concentration becomes 30 mass percent, the fluorine concentration is uniform at approximately 30 mass percent, from the partway position in the direction of film thickness T1 to the surface 31a.

The steam turbine blade 11 of the present embodiment is provided with the anti-fouling film 31 having the type of concentration gradient described above. Therefore, fouling resistance is given to the surface 31a of the anti-fouling film 31. Meanwhile, the hardness is increased on the hard film 2 side of the anti-fouling film 31, and thereby erosion resistance is given thereto. As a result, both fouling and erosion are effectively suppressed.

The anti-fouling film 31 provided on the steam turbine blade 11 of the present embodiment is preferably composed of DLC in which the fluorine concentration on the surface 31a side of the anti-fouling film 31 where the fluorine concentration becomes highest is in a range of not less than 10 mass percent and not more than 40 mass percent. If the fluorine concentration exceeds 40 mass percent on the surface 31a side of the anti-fouling film 31, the film hardness becomes less than 200 Hv and the hardness is insufficient. This type of anti-fouling film 31 may be inappropriate in an environment of actual use. Moreover, if the fluorine concentration on the surface 31a side of the anti-fouling film 31 is less than 10 mass percent, the surface energy becomes significant, and acquisition of an effect of improving the fouling resistance which reduces the amount of silica particles becoming attached becomes difficult.

Therefore, the anti-fouling film 31 is preferably composed of DLC, the fluorine concentration of which on the surface 31a side of the anti-fouling film 31 is in a range of not less than 10 mass percent and not more than 40 mass percent. The fluorine concentration is more preferably in a range of not less than 15 mass percent and not more than 38 mass percent, and most preferably in a range of not less than 20 mass percent and not more than 35 mass percent.

As shown in the example illustrated in the schematic diagram of FIG. 7, in the steam turbine blade 11, for example, the fluorine concentration on the hard film 2 side of the anti-fouling film 31 may also be 10 mass percent. Moreover, since the hard film 2 is provided under the anti-fouling film 31 in this type of case also, it is possible to effectively suppress both fouling and erosion.

Furthermore, the fluorine concentration gradient in the anti-fouling film 31 in the direction of film thickness T1 is not limited to that described above. For example, as illustrated with the broken line in the graph of FIG. 7, there may be a linear relationship between the fluorine concentration and film thickness T1. Alternatively, the relationship between the fluorine concentration and film thickness T1 may be a concentration gradient which combines steep slopes and mild slopes.

The film thickness of the anti-fouling film 31 is preferably in a range of not less than 1 μm and not more than 10 μm, from the point that fouling resistance can be effectively given to the steam turbine blade 11. If the film thickness of the anti-fouling film 31 is less than 1 μm, it becomes difficult to provide the type of fluorine concentration gradient described above, and consequently acquisition of fouling resistance becomes difficult. Moreover, if the film thickness exceeds 10 μm, there is a possibility of an increase in stress in the film, which leads to separation, and the processing time at the time of film formation becomes long. Furthermore, the preferred film thickness of the anti-fouling film 31 is in a range of not less than 1.5 μm and not more than 6 μm, and more preferably in a range of not less than 2 μm and not more than 4 μm.

Hereunder, there is described a method of forming the anti-fouling film 31 composed of fluorine-containing DLC while providing a concentration gradient in the direction of film thickness T1 so that the fluorine concentration becomes higher with approach to the surface 31a of the anti-fouling film 31 from the hard film 2 side.

First, the base material 1, the surface 1a of which has the hard film 2 formed thereon, is introduced into an ionic vapor deposition apparatus, and the pressure inside the apparatus is reduced to $3.0 \times 10^{-3}$ Pa or less by means of vacuum suction. Then, a mixed gas of hexafluorobenzene and benzene is introduced into the ionic vapor deposition apparatus at a pressure in a range of not less than $2.0 \times 10^{-1}$ Pa and not more than $6.5 \times 10^{-1}$ Pa. Then, electrical discharge is conducted under the respective conditions: ion source anode current value approximately 0.4 A; ion source filament current value approximately 30 A; and base material bias voltage value approximately 1.5 kV. Under these conditions, the anti-fouling film 31 composed of fluorine-containing DLC is formed on the entire surface of the hard film 2 formed on the surface 1a.

At this time, the mixture ratio of hexafluorobenzene and benzene immediately after commencing electrical discharge (commencing film formation) is hexafluorobenzene:benzene=50:50. Then, this mixture ratio is changed so that the percentage of hexafluorobenzene becomes higher at a rate of 1%/minute. From the point in time where the percentage of hexafluorobenzene has become 100%, the electrical discharge is maintained for approximately 20 minutes. The above mixed gas ratio is expressed in molar ratio.

Through the respective procedures above, it is possible to form the anti-fouling film 31 shown in the schematic diagram of FIG. 7 in which a concentration gradient is provided in the direction of film thickness T1 so that the fluorine concentration becomes higher with approach to the surface 31a from the hard film 2 side.

In the present embodiment, the method of forming the anti-fouling film 31 by means of an ionic vapor deposition method as with the first embodiment has been described. However, the anti-fouling film 31 may be formed by means of a sputtering method.

The anti-fouling film 31 of the steam turbine blade 11 of the second embodiment of the present invention described above is such that a concentration gradient is provided in the film thickness T1 direction so that the fluorine concentration becomes higher with approach from the hard film 2 side to the surface 31a of the anti-fouling film 31, and the fluorine concentration in the surface 31a is in a range of not less than 10 mass percent and not more than 40 mass percent. Therefore, fouling resistance is given to the surface 31a of the anti-fouling film 31. Meanwhile, the hardness is increased on the hard film 2 side of the anti-fouling film 31, and thereby erosion resistance is given thereto. As a result, both of fouling and erosion can be effectively suppressed. Moreover, even if the anti-fouling film 31 has worn out, the hard film 2 thereunder still suppresses the progress of erosion. Therefore, according to the steam turbine blade 11 of the second embodiment of the present invention, it is possible to realize a steam turbine blade 11 which has a superior level of both fouling resistance and erosion resistance, enables long maintenance intervals, has a long operating life, and can be operated at low running cost.

Third Embodiment

Hereunder, a steam turbine blade 12 of the present embodiment is described, with reference to FIG. 8. In the following description, the same reference symbols are given to configurations similar to those of the steam turbine blade 10 of the first embodiment, and detailed descriptions thereof are omitted.

The steam turbine blade 12 of the present embodiment is of a configuration which differs from that of the steam turbine blade 10 of the first embodiment in that an intermediate layer 4 is provided between the base material 1 and the hard film 2.

The intermediate layer 4 relieves internal stress which occurs in the hard film 2, and has an effect of increasing the level of adhesion between the base material 1 and the hard film 2.

The preferred material of the intermediate layer 4 is Cr or Ti. By configuring the intermediate layer 4 with this type of material, internal stress which occurs in the hard film 2 is more effectively relieved, and the level of adhesion between the base material 1 and the hard film 2 is further improved.

The preferred film thickness of the intermediate layer 4 is in a range of not less than 0.5 μm and not more than 2 μm, from the above point that internal stress which occurs in the hard film 2 can be effectively relieved and the level of adhesion can be further improved.

As the method of forming the intermediate layer 4, a sputtering method similar to that in the method of forming the hard film 2 may be employed with no particular limitations.

According to the turbine blade 12 of the present embodiment, it is possible to obtain the above type of effect in which the level of adhesion between the base material 1 and the hard film 2 can be further increased. Furthermore, with the turbine blade 12, superior erosion resistance and fouling resistance can be obtained as with the steam turbine blade 10 and the steam turbine blade 11 of the first and second embodiments.

Fourth Embodiment

Hereunder, a steam turbine blade 13 of the present embodiment is described, with reference to FIG. 9A and FIG. 9B. In the following description, the same reference symbols are given to configurations similar to those of the steam turbine blade 10, the steam turbine blade 11, and the steam turbine blade 12 of the first to third embodiments, and detailed descriptions thereof are omitted.

The steam turbine blade 13 of the present embodiment is such that as shown with an example in FIG. 9A, an intermediate layer 4 is provided between a base material 1 and a hard film 2. Furthermore, the steam turbine blade 13 is such that between the hard film 2 and an anti-fouling film 3, there is formed an intermediate hard film 5 composed of diamond-like carbon. The steam turbine blade 13 differs from the steam turbine blade 12 of the third embodiment in this point.

It is preferable that the intermediate hard film 5 is composed of DLC, and the film thickness thereof is in a range of not less than 0.5 μm and not more than 2 μm. By providing the intermediate hard film 5 composed of DLC and having a film thickness in this range, the level of adhesion between the hard film 2 and the anti-fouling film 3 is improved. Moreover, even in a case where wear occurs in the anti-fouling film 3 in an erosion occurring portion of the steam turbine blade 13 (refer to region E in FIG. 3), the action of the intermediate hard film 5 and the hard film 2 still effectively suppresses erosion in this portion. Thus, both erosion resistance and fouling resistance of the steam turbine blade 13 can be obtained more effectively.

As the method of forming the intermediate hard film 5, a sputtering method similar to that in the method of forming the hard film 2 may be employed with no particular limitations.

According to the steam turbine blade 13 of the present embodiment, it is possible to obtain the above type of effect in which the level of adhesion between the hard film 2 and the anti-fouling film 3 can be further increased. Furthermore, with the steam turbine blade 13, superior erosion resistance and fouling resistance can be obtained as with the steam turbine blade 10, the steam turbine blade 11, and the steam turbine blade 12 of the first to third embodiments.

The steam turbine blade 13 of the example shown in FIG. 9A has the intermediate layer 4 provided between the base material 1 and the hard film 2 as with the steam turbine blade 12 of the third embodiment, however, it is not limited to this. For example, as with the example shown in FIG. 9B, the steam turbine blade 13 may be configured such that the hard film 2 is formed directly on the surface 1a of the base material 1, and it may be appropriately employed.

Fifth Embodiment

Hereunder, a steam turbine blade 14 of the present embodiment is described, with reference to FIG. 10 and FIG. 11. In the following description, the same reference symbols are given to configurations similar to those of the steam turbine blade 11 of the second embodiment, and detailed descriptions thereof are omitted.

The steam turbine blade 14 of the present embodiment is such that a concentration gradient is provided so that the fluorine concentration becomes higher with approach to the surface 32a side in the direction of film thickness T2, and the fluorine concentration in the surface 32a is in a range of not less than 10 mass percent and not more than 40 mass percent. The steam turbine blade 14 and the steam turbine blade 11 of the second embodiment share a common point such that there is provided an anti-fouling film 32 composed of fluorine-containing DLC, which is a gradient composition film as described above. However, the steam turbine blade 14 differs from the steam turbine blade 11 of the second embodiment in that it is of a single-layer film structure in which the anti-fouling film 32 is directly laminated on the surface 1a of the base material 1.

The anti-fouling film 32 provided in the steam turbine blade 14 of the present embodiment has a fluorine concentration gradient in the direction of film thickness T2 of the anti-fouling film 32 as shown in the graph in the schematic diagram of FIG. 10. In the example shown in FIG. 10, the fluorine concentration on the base material 1 side of the anti-fouling film 32 is approximately 0 mass percent. In contrast, the fluorine concentration on the surface 32a side of the anti-fouling film 32 is approximately 30 mass percent. Moreover, the fluorine concentration and film thickness T2 are in a linear relationship.

Furthermore, the anti-fouling film 32 of the steam turbine blade 14 shown in FIG. 10 is such that the concentration gradient of the fluorine concentration thereof is in the above relationship, and therefore, the hardness thereof changes. As shown in the graph of the diagram, the hardness on the surface 32a side where the fluorine concentration is approximately 30 mass percent is approximately 200 Hv and is soft, while the hardness on the base material 1 side is approximately 3,000 Hv and is hard. Accordingly, fouling resistance is given to a region G in a range of a certain thickness from the surface layer 32a side of the anti-fouling film 32, that is, a region G in a range of approximately ⅔ of the film thickness T2 from the surface layer 32a where the hardness is in a range of not less than 200 Hv and not more than 2,000 Hv in the illustrated example. On the other hand, erosion resistance and a high level of adhesion with the base material 1 are given to a region H in a range of approximately ⅓ of the film thickness T2 from the base material 1 side where the hardness is not less than 2,000 Hv and not more than 3,000 Hv in the direction of film thickness T2 of the anti-fouling film 32.

The hardness was measured in a method similar to that of the hardness measurement described above.

The steam turbine blade 14 is provided with the anti-fouling film 32 described above. Accordingly, even with a configuration in which the hard film 2 of the steam turbine blade 10 shown in FIG. 4 is not provided, fouling resistance and superior erosion resistance are realized. Here, even in a case where the region G on the surface layer 32a side of the soft anti-fouling film 32 becomes separated in the erosion occurring portion (refer to region E in FIG. 3), the region H on the base material 1 side of the hard anti-fouling film 32 remains. Therefore, progress of erosion is suppressed in the steam turbine blade 14. Accordingly, with the steam turbine blade 14 of the present embodiment, superior erosion resistance and fouling resistance can be both obtained as with the steam turbine blade 10, the steam turbine blade 11, the steam turbine blade 12, and the steam turbine blade 13 of the first to fourth embodiments.

The anti-fouling film 32 is preferably composed of DLC in which the fluorine concentration at the surface 32a side where the fluorine concentration becomes highest for a reason similar to that of the anti-fouling film 31 provided in the steam turbine blade 11 of the second embodiment, is in a range of not less than 10 mass percent and not more than 40 mass percent. By configuring the anti-fouling film 32 with DLC having a fluorine concentration in the above range, it is possible to more effectively obtain a high level of fouling resistance. Moreover, the anti-fouling film 32 is preferably composed of DLC with the fluorine concentration thereof on the surface 32a side in a range of not less than 15 mass percent and not more than 38 mass percent, and more preferably in a range of not less than 20 mass percent and not more than 5 mass percent.

The film thickness of the anti-fouling film 32 is preferably in a range of not less than 1 µm and not more than 10 µm, from the point that fouling resistance and erosion resistance can be both effectively given to the steam turbine blade 14. If the film thickness of the anti-fouling film 32 is less than 1 µm, it may become difficult to provide the type of fluorine concentration gradient described above, and consequently acquisition of fouling resistance and erosion resistance may become difficult in some cases. Moreover, if the film thickness of the anti-fouling film 32 exceeds 10 µm, there is a possibility of an increase in stress in the film, which leads to separation, and the processing time at the time of film formation becomes long. Furthermore, the preferred film thickness of the anti-fouling film 32 is in a range of not less than 3 µm and not more than 9 µm, and more preferably in a range of not less than 5 µm and not more than 8 µm.

In an anti-fouling film composed of fluorine-containing DLC, the film thickness which can provide fouling resistance, that is, the minimum film thickness which enables 10 mass percent or more of the fluorine concentration, is considered to be approximately 0.1 µm. For this reason, for example, in the graph of FIG. 10, if the film thickness of a region where the fluorine concentration is 10 mass percent or more is 0.1 µm or more, a sufficient level of fouling resistance can be obtained. In the illustrated example, the fluorine concentration in the region G on the surface 32a side of the anti-fouling film 32 is in an approximate range of not less than 10 mass percent and not more than 30 mass percent.

Moreover, in the above anti-fouling film composed of fluorine-containing DLC, the film thickness which can provide fouling resistance, that is, the minimum film thickness of a region where the fluorine concentration is less than 10 mass percent, is considered to be approximately 0.5 µm. For this reason, for example, in the graph of FIG. 10, if the film thickness of a region where the fluorine concentration is less than 10 mass percent is 0.5 µm or more, a sufficient level of fouling resistance can be obtained. In the illustrated example, the fluorine concentration in the region H on the base material 1 side of the anti-fouling film 32 is in an approximate range of not less than 0 mass percent and not more than 10 mass percent.

Furthermore, in the example shown in FIG. 10, there is provided a concentration gradient in which the fluorine concentration and the film thickness T2 are in a linear relationship, however, it is not limited to this. For example, as illustrated in the example of the schematic diagram of FIG. 11, the fluorine concentration is uniform at approximately 0 mass percent in a region K, which is in a range of an approximately ⅓ from the base material 1 side of the anti-fouling film 32 in the direction of film thickness T2. In a region J thereabove in a range of an approximately ⅔ from the base material 1 side in the direction of film thickness T2, the configuration may be provided with a concentration gradient in which the fluorine concentration gradually rises to approximately 30 mass percent. In a region I above the region J in the illustrated example to the surface 32a in the direction of film thickness T2, the fluorine concentration is uniform at approximately 30 mass percent.

In the region I of the anti-fouling film 32 in the example illustrated in FIG. 11, the hardness is approximately 200 Hv, and the high level of fluorine concentration gives superior fouling resistance. Meanwhile, the hardness in the region K is approximately 3,000 Hv, and superior erosion resistance is given. Accordingly, superior fouling resistance and erosion resistance can both be more effectively obtained.

Moreover, the fluorine concentration gradient of the anti-fouling film 32 in the direction of film thickness T2 is not limited to the above gradient, and for example, the concentration gradient relationship may be configured curved (for example, refer to the curved line illustrated with the broken line in the graph of FIG. 7).

Furthermore, as the method of forming the anti-fouling film 32 composed of DLC provided with the above type of fluorine concentration gradient, the anti-fouling film 32 may be formed in a method the same as that of the anti-fouling film 31 described in the second embodiment.

According to the steam turbine blade 14 of the present embodiment, superior erosion resistance and fouling resistance can both be effectively obtained as with the steam turbine blade 10, the steam turbine blade 11, the steam turbine blade 12, and the steam turbine blade 13 of the first to fourth embodiments. Moreover, since the steam turbine blade 14 is provided with the anti-fouling film 32 of the above configuration, there is no need for a hard film 2, which is provided for the steam turbine blade 10, the steam turbine blade 11, the steam turbine blade 12, and the steam turbine blade 13. As a result, there is obtained an effect in which a manufacturing step thereof can be omitted and manufacturing cost can be reduced.

Sixth Embodiment

Hereunder, a steam turbine blade 15 of the present embodiment is described, with reference to FIG. 12 and FIG. 13. In the following description, the same reference symbols are given to configurations similar to those of the steam turbine blade 12 of the third embodiment and those of the steam turbine blade 14 of the fifth embodiment, and detailed descriptions thereof are omitted.

The configuration of the steam turbine blade 15 of the present embodiment differs from that of the steam turbine blade 14 of the fifth embodiment in that between a base material 1 and an anti-fouling film 32 provided with the type of fluorine concentration gradient described above, there is further provided an intermediate layer 41.

The intermediate layer 41 of the present embodiment relieves internal stress which occurs in the anti-fouling film 32, and has an effect of increasing the level of adhesion between the base material 1 and the anti-fouling film 32.

As the material of the intermediate layer 41, a material similar to that of the intermediate layer 4 provided in the steam turbine blade 12 of the third embodiment may be used. Moreover, the film thickness of the intermediate layer 41 may be made the same as that of the intermediate layer 4.

Furthermore, as the method of forming the intermediate layer 41, a sputtering method similar to that in the method of forming the intermediate layer 4 may be employed with no particular limitations.

According to the steam turbine blade 15 of the present embodiment, it is possible to obtain the above type of effect in which the level of adhesion between the base material 1 and the anti-fouling film 32 can be further increased. Furthermore, with the steam turbine blade 15, superior erosion resistance and fouling resistance can be obtained as with the steam turbine blade 10, the steam turbine blade 11, the steam turbine blade 12, the steam turbine blade 13, and the steam turbine blade 14 of the first to fifth embodiments. Moreover, the steam turbine blade 15 does not require a hard film as with the steam turbine blade 14 of the fifth embodiment, and it is therefore possible to reduce manufacturing cost.

Seventh Embodiment

Hereunder, a steam turbine blade 16 of the present embodiment is described, with reference to FIG. 14. In the following description, the same reference symbols are given to configurations similar to those of the steam turbine blade 11 of the second embodiment, and detailed descriptions thereof are omitted.

The steam turbine blade 16 of the present embodiment differs from the steam turbine blade 12 of the second embodiment in that between a hard film 2 and an anti-fouling film 31, there is further formed an intermediate hard film 5.

The intermediate hard film 5 provided in the steam turbine blade 16 of the present embodiment is similar to that provided in the steam turbine blade 14 of the fifth embodiment. According to the steam turbine blade 16, by providing the intermediate hard film 5, there is obtained an effect in which the level of adhesion between the hard film 2 and the anti-fouling film 31 can be further increased. Moreover, as with the steam turbine blade 11, the steam turbine blade 16 is provided with the anti-fouling film 31 having a fluorine concentration gradient, and therefore, superior erosion resistance and fouling resistance can be obtained.

Eighth Embodiment

Hereunder, a steam turbine blade 17 of the present embodiment is described, with reference to FIG. 15. In the following description, the same reference symbols are given to configurations similar to those of the steam turbine blade 11 of the second embodiment, and detailed descriptions thereof are omitted.

The steam turbine blade 17 of the present embodiment differs from the steam turbine blade 12 of the second embodiment in that between a base material 1 and a hard film 2, there is further formed an intermediate layer 4.

The intermediate layer 4 provided in the steam turbine blade 17 of the present embodiment is similar to that provided in the steam turbine blade 12 of the third embodiment. The steam turbine blade 17 is provided with the intermediate layer 4, and therefore, there is obtained an effect in which the level of adhesion between the base material 1 and the hard film 2 can be further increased. Moreover, as with that described above, the steam turbine blade 17 is provided with the anti-fouling film 31 having a fluorine concentration gradient, and therefore, superior erosion resistance and fouling resistance can be obtained.

Ninth Embodiment

Hereunder, a steam turbine blade 18 of the present embodiment is described, with reference to FIG. 16. In the following description, the same reference symbols are given to configurations similar to those of the steam turbine blade 11 of the second embodiment, and detailed descriptions thereof are omitted.

The steam turbine blade 18 of the present embodiment differs from the steam turbine blade 12 of the second embodiment in that an intermediate layer 4 is further formed between a base material 1 and a hard film 2, and an intermediate hard film 5 composed of DLC is formed between the hard film 2 and an anti-fouling film 31.

The intermediate layer 4 provided in the steam turbine blade 18 of the present embodiment is similar to that provided in the steam turbine blade 12 of the third embodiment. Moreover, the intermediate hard film 5 is similar to that provided in the steam turbine blade 14 of the fifth embodiment.

The steam turbine blade 18 is such that the intermediate layer 4 further increases the level of adhesion between the base material 1 and the hard film 2. Furthermore, there is obtained an effect in which the intermediate hard film 5 further increases the level of adhesion between the hard film 2 and the anti-fouling film 31. Moreover, as with that described above, the steam turbine blade 18 is provided with the anti-fouling film 31 having a fluorine concentration gradient, and therefore, superior erosion resistance and fouling resistance can be obtained.

(Another Example of Component for Rotary Machine)

In the present invention, by forming an anti-fouling film similar to those of the steam turbine blades described above on the surface of a base material, it is possible to configure a component for a rotary machine such as an impeller and rotor provided in a compressor pump, which is used in a chemical plant to compress various types of gas.

Although no detailed illustration is made here, for example, in a case of configuring an impeller of a compressor pump as the component for a rotary machine according to the present invention, on the surface of the impeller, there may be provided an anti-fouling film and a hard film similar to those of the steam turbine blade shown in FIG. 4. Accordingly, as with the steam turbine blade according to the present invention, the impeller can suppress the occurrence of fouling, and further, the occurrence of erosion can be suppressed even if a gas comes in direct contact with the impeller.

Furthermore, if the configuration is such that an intermediate layer similar to that of the above steam turbine blade is provided between a base material and a hard film of the impeller, this is preferable from the point that the internal stress which occurs in the hard film can be relieved and the level of adhesion between the base material and the hard film can be further increased (refer to the description of the steam turbine blade 12 of the third embodiment).

Furthermore, if the configuration is such that an intermediate hard film similar to that of the steam turbine blade described above is provided between the hard film and the anti-fouling film of the impeller, this is preferable from the point that the level of erosion resistance can be further increased (refer to the description of the steam turbine blade 13 of the fourth embodiment).

Moreover, with a configuration such that an anti-fouling film composed of DLC provided with a fluorine concentration gradient is provided on the surface of the base material of an impeller, fouling resistance and erosion resistance can be both obtained without providing a hard film on the base material (refer to the descriptions of the steam turbine blades 14 and 15 of the fifth and sixth embodiments).

Furthermore, the anti-fouling film, the hard film, the intermediate layer, and the hard film layer provided in the component for a rotary machine of the present embodiment are respectively similar to the films of the steam turbine blades described above, and therefore, the material and film thickness thereof as well as the manufacturing steps of the film forming method thereof may be common thereamong.

For example, as the method of forming an anti-fouling film on the impeller surface of a compressor pump described above, there is employed an ionic vapor deposition method in which a reactive gas is ionized and deposited by discharging an electron beam. Moreover, by forming the anti-fouling film on the base material under conditions similar to those of the steam turbine blades described above, films having superior fouling resistance can be obtained.

The preferred embodiments of the present invention have been described above. However, the present invention is not limited to the above embodiments, and addition, omission, substitution, and other types of modification may be made to the configurations without departing from the scope of the present invention. The present invention is not to be considered as being limited to the above descriptions, and it should be considered as being limited solely by the appended claims.

The invention claimed is:

1. A component for a rotary machine, comprising:
    a base material;
    a hard film comprising one or more types of materials selected from TiAlN, TiCN and ZrN; and
    an anti-fouling film comprising a diamond-like carbon film containing fluorine,
    wherein the hard film and the anti-fouling film are laminated on the surface of a base material, in that order,
    and wherein the fluorine concentration of the anti-fouling film is in a range of not less than 30 mass percent and not more than 40 mass percent.

2. A component for a rotary machine according to claim 1, further comprising an intermediate hard film formed between the hard film and the anti-fouling film, the intermediate hard film being comprised of diamond-like carbon.

3. A component for a rotary machine according to claim 1, further comprising an intermediate layer formed between the base material and the hard film.

4. A component for a rotary machine according to claim 1, wherein the anti-fouling film is such that a concentration gradient is provided in the film thickness direction so that the fluorine concentration becomes higher with an approach from the hard film side to the anti-fouling film surface, and the anti-fouling film is of a gradient composition film in which the fluorine concentration in the surface is not less than 30 mass percent and not more than 40 mass percent.

5. A component for a rotary machine according to claim 4, further comprising an intermediate hard film formed between the hard film and the anti-fouling film, the intermediate hard film being comprised of diamond-like carbon.

6. A component for a rotary machine according to claim 5, further comprising an intermediate layer formed between the base material and the hard film.

7. A component for a rotary machine according to claim 1, wherein the anti-fouling film in an erosion-occurring portion of the component for a rotary machine is worn out.

8. A component for a rotary machine according to claim 1,
    wherein the anti-fouling film is formed on the surface of a base material, the anti-fouling film has a concentration gradient provided in the film thickness direction so that the fluorine concentration thereof becomes higher with an approach from the hard film side to the anti-fouling film surface, and the anti-fouling film is of a gradient composition film in which the fluorine concentration in the surface is not less than 30 mass percent and not more than 40 mass percent.

9. A component for a rotary machine according to claim 8, further comprising an intermediate layer formed between the base material and the anti-fouling film.

10. A steam turbine having rotor blades,
    wherein the rotor blade is configured with a component according to claim 1.

* * * * *